(12) United States Patent
Ditzel et al.

(10) Patent No.: US 7,579,221 B1
(45) Date of Patent: Aug. 25, 2009

(54) CONVERSION OF AN SOI DESIGN LAYOUT TO A BULK DESIGN LAYOUT

(76) Inventors: David R. Ditzel, 4010 Page Mill Rd., Los Altos Hills, CA (US) 94022; James B. Burr, 511 Broughton La., Foster City, CA (US) 94404; Robert P. Masleid, 17266 Eaton La., Monte Sereno, CA (US) 95930

(*) Notice: Subject to any disclaimer, the term of this patent is extended or adjusted under 35 U.S.C. 154(b) by 384 days.

(21) Appl. No.: 11/393,555

(22) Filed: Mar. 29, 2006

(51) Int. Cl.
*H01L 21/00* (2006.01)
*H01L 21/84* (2006.01)
*H01L 21/20* (2006.01)
*H01L 21/36* (2006.01)

(52) U.S. Cl. ............... 438/149; 438/479; 438/480

(58) Field of Classification Search .......... 438/149, 438/479, 480, E27.112, E29.147
See application file for complete search history.

(56) References Cited

U.S. PATENT DOCUMENTS

| | | | |
|---|---|---|---|
| 6,272,666 B1 | 8/2001 | Borkar et al. | |
| 6,385,761 B1 | 5/2002 | Breid | |
| 6,470,482 B1 | 10/2002 | Rostoker et al. | |
| 6,530,068 B1 | 3/2003 | Cao et al. | |
| 6,609,227 B2 | 8/2003 | Bradley et al. | |
| 6,782,516 B2 | 8/2004 | Rittman et al. | |
| 6,861,374 B2* | 3/2005 | Oyamatsu | 438/479 |
| 6,875,665 B2* | 4/2005 | Hokazono et al. | 438/149 |
| 6,877,144 B1 | 4/2005 | Rittman et al. | |
| 6,907,587 B2 | 6/2005 | Rittman et al. | |
| 6,918,100 B2 | 7/2005 | Kresh et al. | |
| 6,928,626 B1 | 8/2005 | McGaughy et al. | |
| 7,051,295 B2 | 5/2006 | Narendra et al. | |
| 2002/0038446 A1 | 3/2002 | Ioudovski | |
| 2004/0128631 A1 | 7/2004 | Ditzel et al. | |
| 2004/0143808 A1 | 7/2004 | Hegde et al. | |
| 2005/0028113 A1 | 2/2005 | Lin et al. | |
| 2005/0097496 A1 | 5/2005 | Koike et al. | |

* cited by examiner

*Primary Examiner*—Cuong Q Nguyen

(57) ABSTRACT

An SOI design layout is converted to a bulk design layout. According to a method of converting a first semiconductor design layout based on an Silicon-on-Insulator (SOI) process to a second semiconductor design layout based on a bulk process, an insulator layer of the SOI process beneath active devices in the first semiconductor design layout is removed. A conductive sub-surface structure for routing voltage is added to the first semiconductor design layout. Further, the active devices from the SOI process are converted to the bulk process to form the second semiconductor design layout without requiring a relayout of the first semiconductor design layout on a semiconductor surface. The bulk design layout is utilized to fabricate a semiconductor device having a plurality of active devices.

26 Claims, 8 Drawing Sheets

CONVERSION OF AN SOI DESIGN LAYOUT TO A BULK DESIGN LAYOUT

BACKGROUND OF THE INVENTION

1. Field of the Invention

The present invention generally relates to semiconductor devices and fabrication processes. More particularly, the present invention relates to the field of conversion of an SOI (Silicon-on-Insulator) design layout to a bulk design layout.

2. Related Art

There are several types of fabrication processes available for the fabrication of semiconductor devices. Each fabrication process has its advantages and disadvantages. Moreover, each fabrication process requires a set of design rules to generate a semiconductor design layout that is utilized to fabricate the semiconductor device. In general, the semiconductor design layout shows the location and composition of active devices, metal wires, interconnections, and other components on a semiconductor wafer. Examples of active devices include pFETS (or p-type MOSFETS) and nFETS (or n-type MOSFETS).

SUMMARY OF THE INVENTION

An SOI design layout is converted to a bulk design layout. According to a method of converting a first semiconductor design layout based on an Silicon-on-Insulator (SOI) process to a second semiconductor design layout based on a bulk process, an insulator layer of the SOI process beneath active devices in the first semiconductor design layout is removed. A conductive sub-surface structure for routing voltage is added to the first semiconductor design layout. Further, the active devices from the SOI process are converted to the bulk process to form the second semiconductor design layout without requiring a relayout of the first semiconductor design layout on a semiconductor surface. The bulk design layout is utilized to fabricate a semiconductor device having a plurality of active devices.

BRIEF DESCRIPTION OF THE DRAWINGS

The accompanying drawings, which are incorporated in and form a part of this specification, illustrate embodiments of the invention and, together with the description, serve to explain the principles of the present invention.

DETAILED DESCRIPTION OF THE INVENTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Figure 1A:
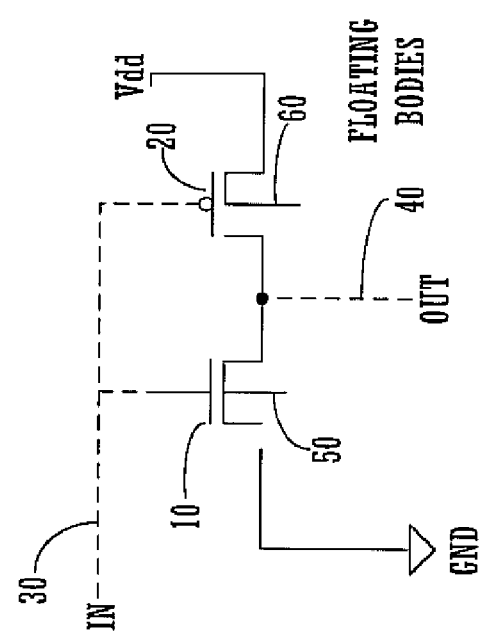
FIG. 1A illustrates a circuit schematic for an inverter device based on an SOI (Silicon-on-Insulator) process in accordance with an embodiment of the present invention.

FIG. 1A illustrates a circuit schematic for an inverter device 100A based on an SOI (Silicon-on-Insulator) process in accordance with an embodiment of the present invention. As shown in FIG. 1A, the inverter device 100A has active devices 10 and 20. The active device 10 is an nFET (or n-type MOSFET) 10 while active device 20 is a pFET (or p-type MOSFET) 20. In practice, an input signal 30 is applied to the gate terminals of the nFET 10 and the pFET 20. The output signal 40 is taken from the drains of both the nFET 10 and the pFET 20, which are coupled together. The body terminal 50 of the nFET 10 and the body terminal 60 of the pFET 60 are left floating, which creates the SOI "floating body effect" (or "history effect"). It should be understood that the SOI (Silicon-on-Insulator) process may be used to fabricate other types of semiconductor devices.

Figure 1B:
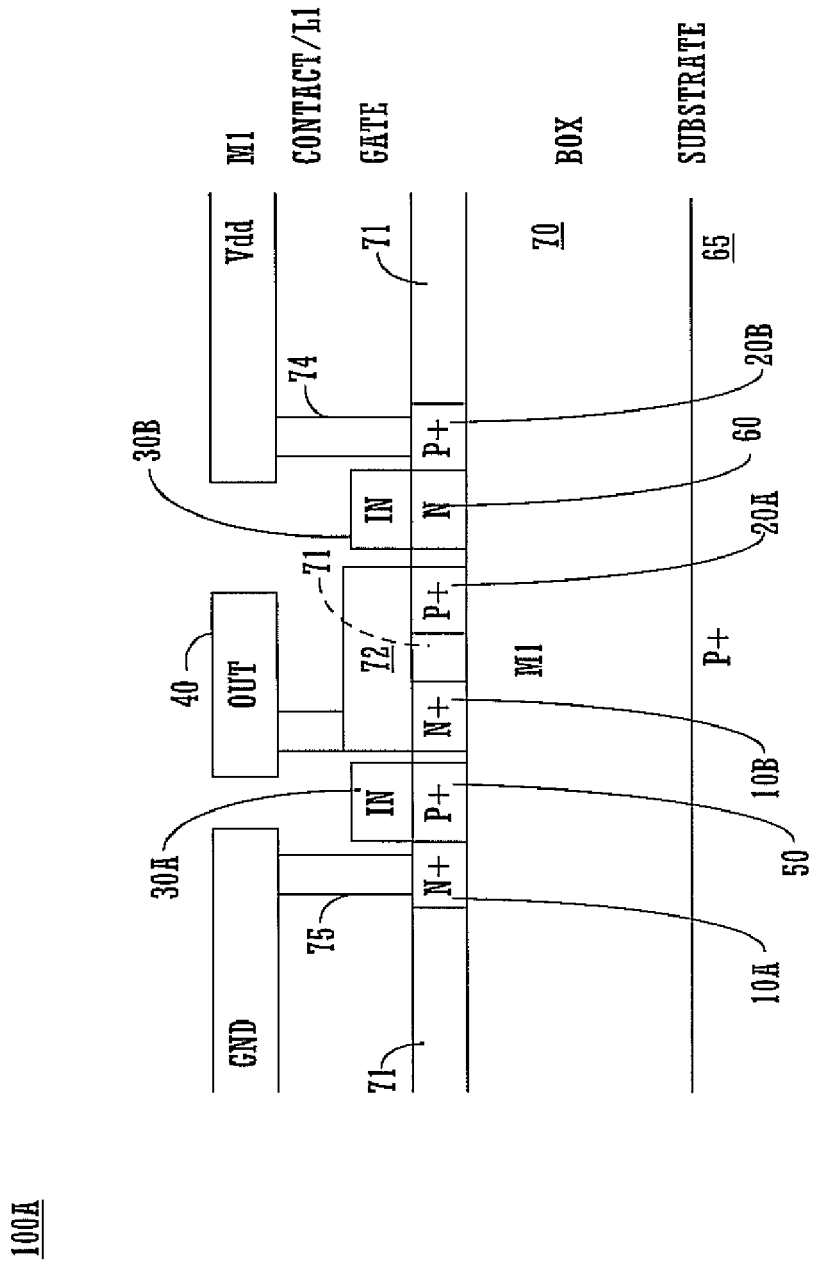
FIG. 1B illustrates an inverter device based on an SOI (Silicon-on-Insulator) process in accordance with an embodiment of the present invention, showing use of a semiconductor design layout based on the Silicon-on-Insulator (SOI) process.

FIG. 1B illustrates an inverter device 100A fabricated based on an SOI (Silicon-on-Insulator) process in accordance with an embodiment of the present invention, showing use of a semiconductor design layout based on the Silicon-on-Insulator (SOI) process. As depicted in FIG. 1B, the inverter device 100A has a substrate 65 doped with a p-type dopant. Although the substrate 65 is shown heavily doped, the substrate 65 may have other doping concentrations. An insulator layer 70 is formed above the substrate 65. The insulator layer 70 provides an insulating floor that cuts off all connections between active devices (e.g., nFETS and pFETS) and the substrate 65 or any layer below the insulator layer 70. In an embodiment, the insulator layer 70 is a buried oxide layer (BOX). The insulator layer 70 may be formed in other ways and may be composed of other materials.

An nFET and a pFET are formed above the insulator layer 70. The nFET includes source 10A doped with n-type dopant, drain 10B doped with n-type dopant, gate 30A, and body 50 doped with p-type dopant. The pFET includes source 20B doped with p-type dopant, drain 20A doped with p-type dopant, gate 30B, and body 60 doped with n-type dopant. The sources 10A and 20B and the drains 10B and 20A are diffusion regions. As described above, the body 50 of the nFET and the body 60 of the pFET are left floating, which creates the SOI "floating body effect" (or "history effect"). The source 10A is coupled to ground metal wire Gnd via contact 75 while source 20B is coupled to supply voltage metal wire Vdd via contact 74. Further, drain 10B and drain 20A are coupled via local interconnect (LI) 72. The local interconnect (LI) 72 is coupled to output metal wire 40 via contact 76. The input metal wire (not shown) is coupled to the gates 30A and 30B of nFET and pFET respectively. Moreover, shallow trench isolation (STI) regions 71 and the insulator layer 70 isolate the nFET and the pFET from each other and from other components.

The semiconductor design layout utilized to fabricate the inverter device 100A is based on the SOI process. Substantial financial resources and time are required to generate this semiconductor design layout.

As depicted in FIG. 1B, the body 50 of the nFET and the body 60 of the pFET in the SOI design are small. That is, the body 50 of the nFET and the body 60 of the pFET in the SOI design may not have sufficient area for at least one tap thereto. This prevents forming a tap to body 50 of the nFET so that a voltage may be routed to the body 50. Similarly, a tap to body 60 of the pFET may not be formed so that a voltage may be routed to the body 60. Although the above case may be prevalent in most of the SOI design, there may still be some active devices in the SOI design that have sufficient area for at least one tap thereto. Since the semiconductor design layout based on the SOI process required substantial financial resources and time, it would be efficient and cost-friendly to be able to convert the SOI design layout to a semiconductor design layout which is based on another process, such as the bulk process, without requiring a relayout of the SOI design layout on the semiconductor surface.

Figure 2:
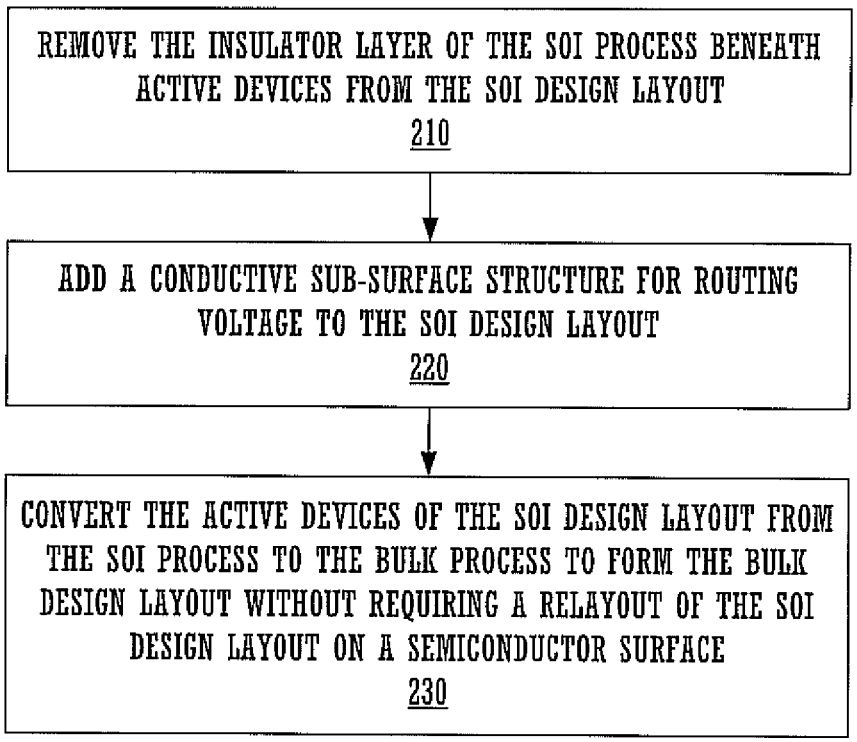
FIG. 2 illustrates a flow chart showing a method of converting a first semiconductor design layout based on an Silicon-on-Insulator (SOI) process to a second semiconductor design layout based on a bulk process in accordance with an embodiment of the present invention.

FIG. 2 illustrates a flow chart showing a method 200 of converting a SOI design layout based on an Silicon-on-Insulator (SOI) process to a bulk design layout based on a bulk process in accordance with an embodiment of the present invention. A semiconductor device (e.g., an inverter device) may be formed from this bulk design layout, wherein the fabricated semiconductor device includes active devices (e.g., pFETS (or p-type MOSFETS) and nFETS (or n-type MOSFETS)). In an embodiment, the present invention is implemented as computer-executable instructions for performing aspects of the present invention illustrated with the method 200. The computer-executable instructions may be stored in any type of computer-readable medium, such as a magnetic disk, CD-ROM, an optical medium, a floppy disk, a flexible disk, a hard disk, a magnetic tape, a RAM, a ROM, a PROM, an EPROM, a flash memory, or any other medium from which a computer can read.

At Block 210, the insulator layer 70 (FIG. 1B) of the SOI process beneath active devices (e.g., nFETS and pFETS) is removed from the SOI design layout.

Continuing, at Block 220, a conductive sub-surface structure for routing voltage is added to the SOI design layout. In a first embodiment, the conductive sub-surface structure is a deep N-well mesh (see FIG. 3B). In a second embodiment, the conductive sub-surface structure is a substrate routing structure (see FIG. 4). In a third embodiment, the conductive sub-surface structure is an epitaxial routing structure (see FIG. 5).

In an embodiment, a plurality of conductive sub-surface structures for routing voltage are added to the SOI design layout. Each conductive sub-surface structure may be utilized to route a respective supply voltage to a respective portion of the active devices. Thus, various supply voltage domains may be formed, which are isolated from each other. Also, each conductive sub-surface structure may be utilized to route the same supply voltage to a respective portion of the active devices.

In yet another embodiment, each conductive sub-surface structure (added to the SOI design layout) may be utilized to route a respective body voltage for biasing to a respective portion of the active devices. Thus, various body voltage domains may be formed, which are isolated from each other. Also, each conductive sub-surface structure may be utilized to route the same body voltage to a respective portion of the active devices.

Furthermore, at Block 230, the active devices (e.g., nFETS and pFETS) of the SOI design layout are converted from the SOI process to the bulk process to form the bulk design layout without requiring a relayout of the SOI design layout on a semiconductor surface. In an embodiment, the active devices are classified into a first group and into a second group. The first group represents active devices having a surface N-well with sufficient area for at least one tap thereto. The second group represents active devices having a surface N-well with insufficient area for at least one tap thereto. Further, each conductive sub-surface structure for routing voltage to the surface N-well is placed between at least one active device from the first group and at least one active device from the second group. Thus, the location and composition of active devices, metal wires, interconnections, and other components from the SOI design layout may remain unchanged. In an embodiment, the active devices of a semiconductor device fabricated using the bulk design layout include no taps to surface P-wells. Moreover, at least a portion of the active devices of the semiconductor device fabricated using the bulk design layout include taps to surface N-wells.

Figure 3A:
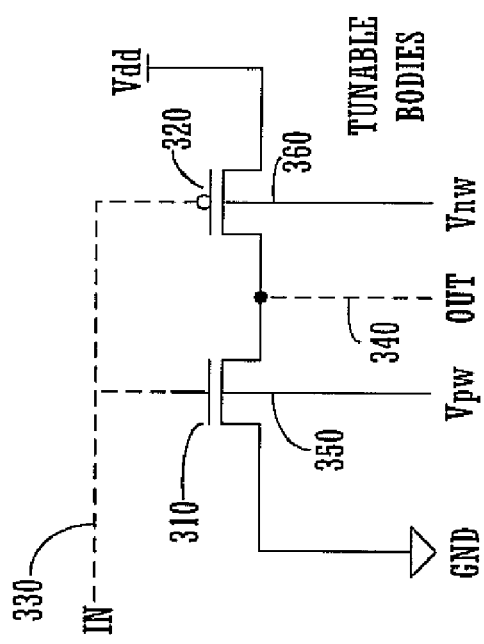
FIG. 3A illustrates a circuit schematic for an inverter device based on a bulk process in accordance with an embodiment of the present invention.

FIG. 3A illustrates a circuit schematic for an inverter device 300A based on a bulk process in accordance with an embodiment of the present invention. As shown in FIG. 3A, the inverter device 300A has active devices 310 and 320. The active device 310 is an nFET (or n-type MOSFET) 310 while active device 320 is a pFET (or p-type MOSFET) 320. In practice, an input signal 330 is applied to the gate terminals of the nFET 310 and the pFET 320. The output signal 340 is taken from the drains of both the nFET 310 and the pFET 320, which are coupled together. The body terminal 350 of the nFET 310 receives a voltage Vpw while the body terminal 360 of the pFET 360 receives a voltage Vnw. For example, the voltage Vpw may be ground GND. In another example, the voltage Vpw may be a body voltage for biasing the nFET 310. Similarly, the voltage Vnw may be a supply voltage Vdd. Also, the voltage Vnw may be a body voltage for biasing the pFET 320. Body voltage for biasing enables control of the potential difference between the body terminal 350 of the nFET 310 and the other nFET terminals and the potential difference between the body 360 of the pFET 320 and the other pFET terminals, providing the ability to electrically tune the threshold voltage level of the nFET 310 and the pFET 320 for process, performance, and current leakage control. It should be understood that the bulk process may be used to fabricate other types of semiconductor devices.

Figure 3B:
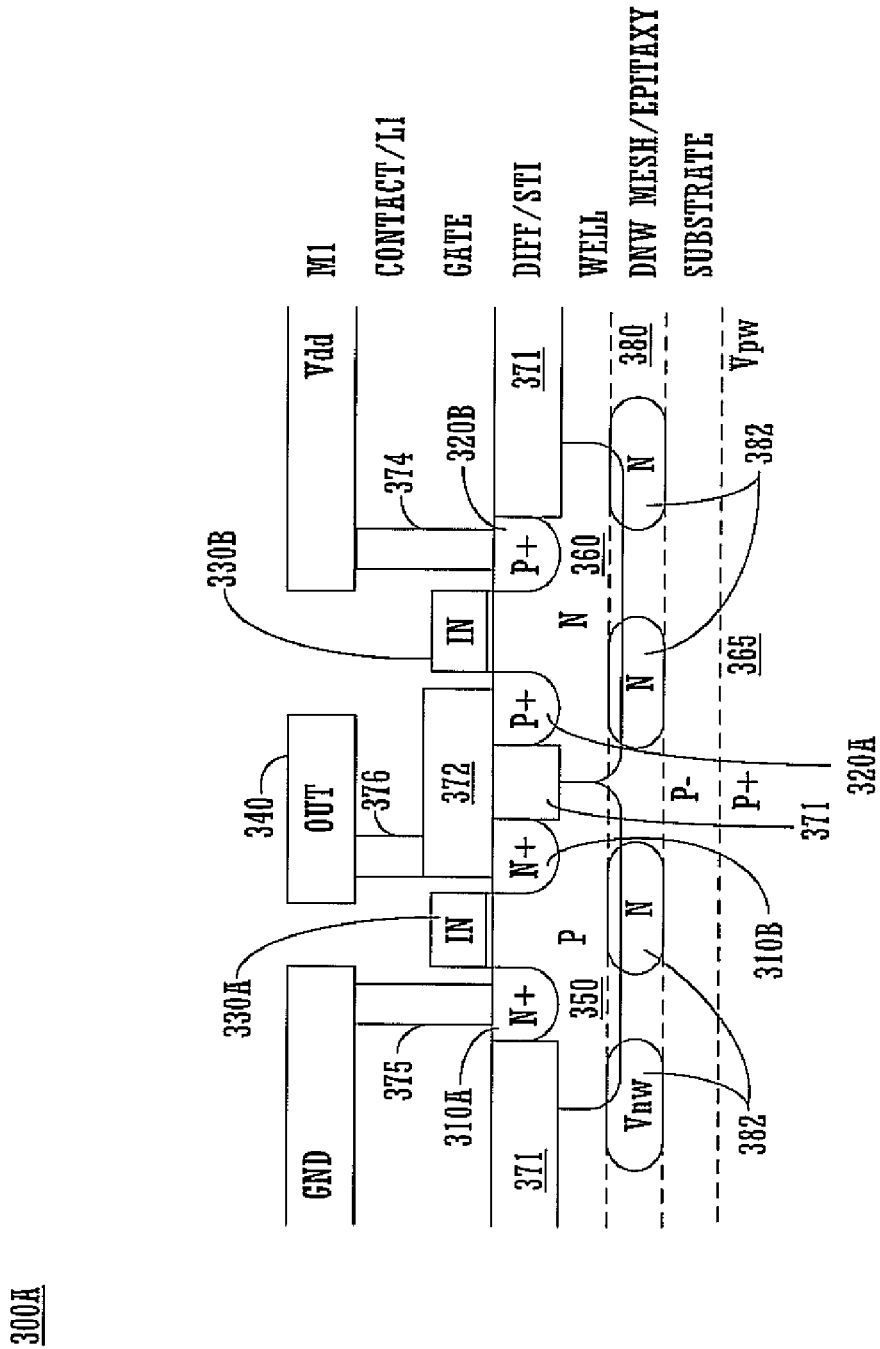
FIG. 3B illustrates an inverter device based on a bulk process in accordance with a first embodiment of the present invention, showing use of a semiconductor design layout based on the bulk process that is converted from another semiconductor design layout based on an Silicon-on-Insulator (SOI) process.
Figure 4:
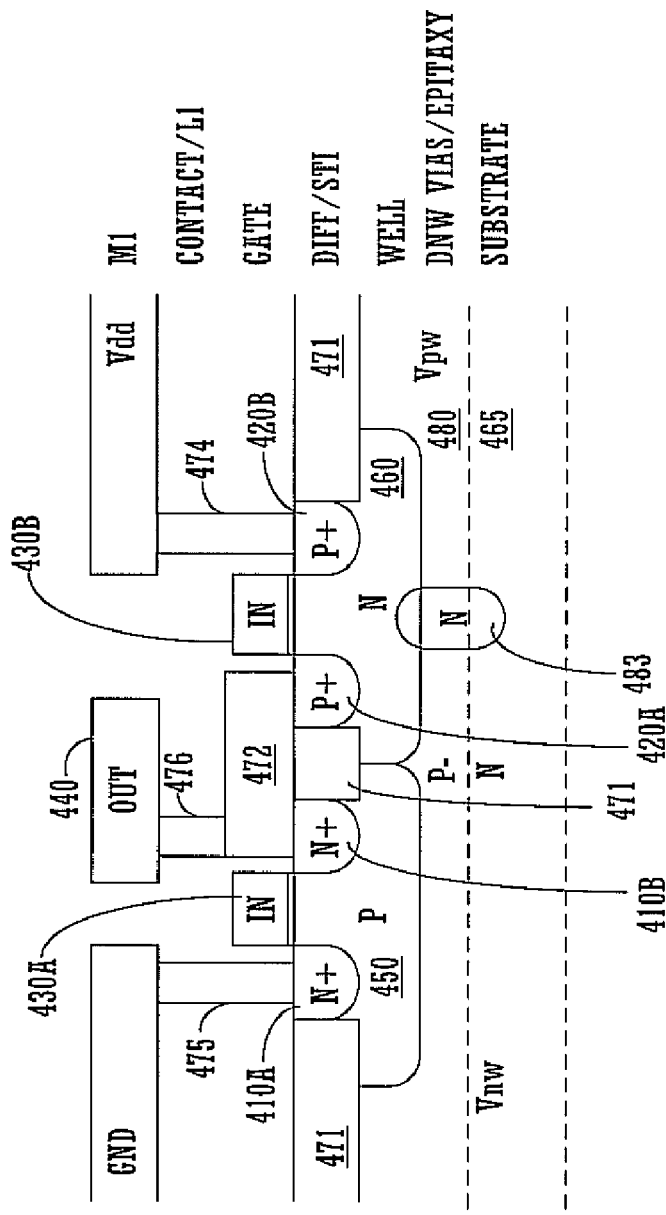
FIG. 4 illustrates an inverter device based on a bulk process in accordance with a second embodiment of the present invention, showing use of a semiconductor design layout based on the bulk process that is converted from another semiconductor design layout based on an Silicon-on-Insulator (SOI) process.
Figure 5:
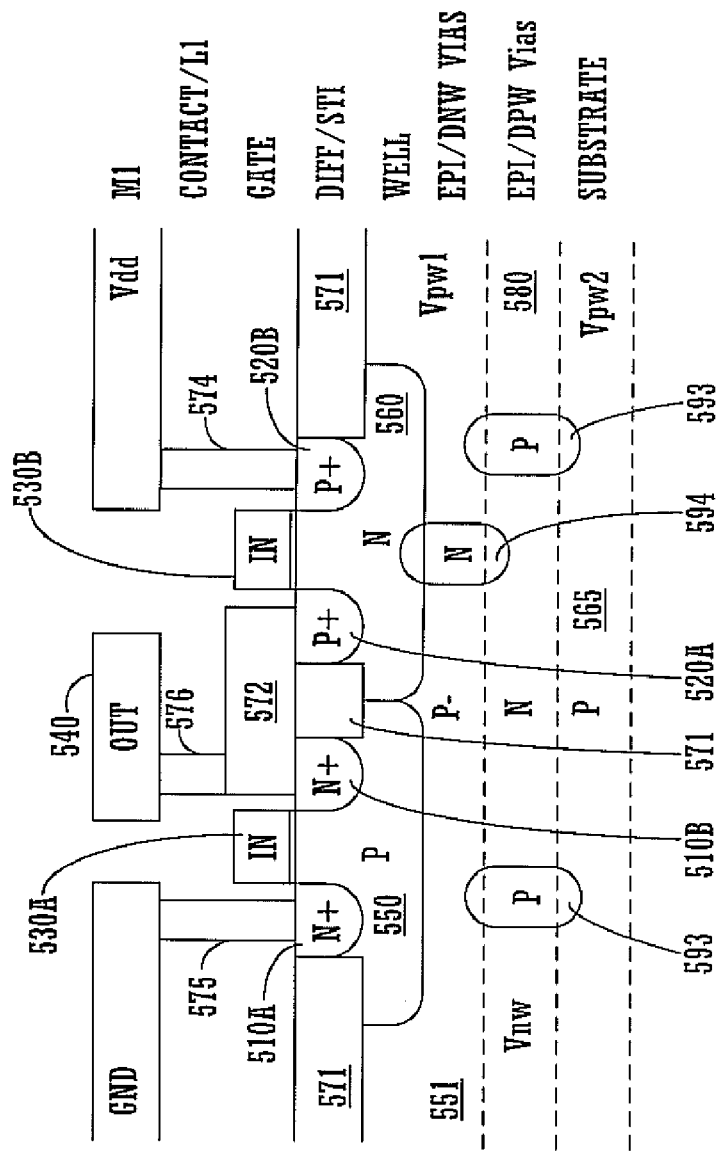
FIG. 5 illustrates an inverter device based on a bulk process in accordance with a third embodiment of the present invention, showing use of a semiconductor design layout based on the bulk process that is converted from another semiconductor design layout based on an Silicon-on-Insulator (SOI) process.

The circuit schematic of FIG. 3A is applicable to the inverter devices of FIGS. 3B, 4, and 5.

FIG. 3B illustrates an inverter device 300A fabricated based on a bulk process in accordance with a first embodiment of the present invention, showing use of a semiconductor design layout based on the bulk process that is converted from another semiconductor design layout based on an Silicon-on-Insulator (SOI) process (FIG. 1B). The inverter device 300A is fabricated using a semiconductor design layout based on the bulk process that is generated using the method 200 (FIG. 2). A comparison of the location and composition of active devices, metal wires, interconnections, and other components of FIGS. 1B and 3B indicates that a relayout of the semiconductor design layout based on the SOI process (FIG. 1B) on the semiconductor surface was not required in order to fabricate the inverter device 300A based on a bulk process.

As depicted in FIG. 3B, the inverter device 300A has a substrate 365 doped with a p-type dopant. Although the substrate 365 is shown heavily doped, the substrate 365 may have other doping concentrations. Optionally, an epitaxy layer 380 is formed above the substrate 365, whereas the epitaxy layer 380 has a p-type doping. Further, a conductive sub-surface structure 382 is formed in the epitaxy layer 380. If the epitaxy layer 380 is omitted, the conductive sub-surface structure 382 is formed in the substrate 365. The conductive sub-surface structure 382 is a deep N-well mesh 382 having an n-type doping. The body 350 of nFET 310 is a surface p-well 350 while the body 360 of pFET 320 is a surface n-well 360. The deep N-well mesh 382 supports routing voltage Vnw to the body 360 (which is n-type doped) of pFET. Moreover, the voltage Vpw is routed to the body 350 (which is p-type doped) of the nFET by the substrate 365. As a result, the inverter device 300A does not require creation of taps to the nFET and pFET, tap contacts, or tap contact metal wires, enabling conversion of the SOI design layout (FIG. 1B) to the bulk design layout (FIG. 3B) without requiring a relayout of the SOI design layout. As described above, the voltage Vpw may be, for example, ground GND or a body voltage for biasing the nFET 310. Additionally, the voltage Vnw may be, for example, a supply voltage Vdd or a body voltage for biasing the pFET 320. Various supply voltage domains or body voltage domains may be formed as discussed above.

Description of the deep N-well mesh 382 for routing voltage can be found in the patent application entitled "METHOD AND APPARATUS FOR OPTIMIZING BACK-BIAS CONNECTIONS IN CMOS CIRCUITS USING A DEEP N-WELL GRID STRUCTURE", U.S. patent application Ser. No. 10/683,961, filed on Oct. 10, 2003 by James B. Burr and William Schnaitter, and in the patent application entitled "LAYOUT PATTERNS FOR DEEP WELL REGION TO FACILITATE ROUTING BODY VOLTAGE", U.S. patent application Ser. No. 10/683,732, filed on Oct. 10, 2003 by Michael Pelham and James B. Burr, which are assigned to the assignee of the present patent application, and which are incorporated by reference in their entirety herein.

An nFET is formed in the p-well 350 while and a pFET is formed in the n-well 360. The nFET includes source 310A doped with n-type dopant, drain 310B doped with n-type dopant, gate 330A, and body 350 doped with p-type dopant. The pFET includes source 320B doped with p-type dopant, drain 320A doped with p-type dopant, gate 330B, and body 360 doped with n-type dopant. The sources 310A and 320B and the drains 310B and 320A are diffusion regions. The source 310A is coupled to ground metal wire Gnd via contact 375 while source 320B is coupled to supply voltage metal wire Vdd via contact 374. Further, drain 310B and drain 320A are coupled via local interconnect (LI) 372. The local interconnect (LI) 372 is coupled to output metal wire 340 via contact 376. The input metal wire (not shown) is coupled to the gates 330A and 330B of nFET and pFET respectively.

Moreover, shallow trench isolation (STI) regions 371 and the depletion regions of the P/N junctions isolate the nFET and the pFET from each other and from other components.

FIG. 4 illustrates an inverter device 400 fabricated based on a bulk process in accordance with a second embodiment of the present invention, showing use of a semiconductor design layout based on the bulk process that is converted from another semiconductor design layout based on a Silicon-on-Insulator (SOI) process (FIG. 1B). The inverter device 400 is fabricated using a semiconductor design layout based on the bulk process that is generated using the method 200 (FIG. 2). A comparison of the location and composition of active devices, metal wires, interconnections, and other components of FIGS. 1B and 4 indicates that a relayout of the semiconductor design layout based on the SOI process (FIG. 1B) on the semiconductor surface was not required in order to fabricate the inverter device 400 based on a bulk process.

As depicted in FIG. 4, the inverter device 400 has a substrate 465 doped with an n-type dopant. An epitaxy layer 480 is formed above the substrate 465, wherein the epitaxy layer 480 has a p-type doping. Further, a via connection 483 (which is n-type doped) is formed in the epitaxy layer 480, wherein the via connection 483 couples the substrate 465 to the body 460 (which is n-type doped) of the pFET. The via connection 483 may be a deep n-well. The body 450 of the nFET is a surface p-well 450 while the body 460 of the pFET is a surface n-well 460. The conductive sub-surface structure, which is comprised of the substrate 465, the epitaxy layer 480, and the via connection 483, supports routing voltage Vnw to the body 460 (which is n-type doped) of the pFET. This substrate routing structure routes the voltage Vnw to the body 460 (which is n-type doped) of the pFET by using the substrate 465 and the via connection 483. Moreover, this substrate routing structure for voltage routes the voltage Vpw to the body 450 (which is p-type doped) of the nFET by using the epitaxy layer 480. As a result, the inverter device 400 does not require creation of taps to the nFET and pFET, tap contacts, or tap contact metal wires, enabling conversion of the SOI design layout (FIG. 1B) to the bulk design layout (FIG. 4) without requiring a relayout of the SOI design layout. As described above, the voltage Vpw may be, for example, ground GND or a body voltage for biasing the nFET. Additionally, the voltage Vnw may be, for example, a supply voltage Vdd or a body voltage for biasing the pFET. Various supply voltage domains or body voltage domains may be formed as discussed above.

Description of a substrate routing structure for voltage can be found in the patent application entitled "SYSTEMS AND METHODS FOR VOLTAGE DISTRIBUTION VIA EPITAXIAL LAYERS", U.S. patent application Ser. No. 10/990,885, filed on Nov. 16, 2004 by Robert P. Masleid, which is assigned to the assignee of the present patent application, and which is incorporated by reference in its entirety herein.

An nFET is formed in the p-well 450 while and a pFET is formed in the n-well 460. The nFET includes source 410A doped with n-type dopant, drain 410B doped with n-type dopant, gate 430A, and body 450 doped with p-type dopant. The pFET includes source 420B doped with p-type dopant, drain 420A doped with p-type dopant, gate 430B, and body 460 doped with n-type dopant. The sources 410A and 420B and the drains 410B and 420A are diffusion regions. The source 410A is coupled to ground metal wire Gnd via contact 475 while source 420B is coupled to supply voltage metal wire Vdd via contact 474. Further, drain 410B and drain 420A are coupled via local interconnect (LI) 472. The local interconnect (LI) 472 is coupled to output metal wire 440 via contact 476. The input metal wire (not shown) is coupled to the gates 430A and 430B of nFET and pFET respectively. Moreover, shallow trench isolation (STI) regions 471 and the depletion regions of the P/N junctions isolate the nFET and the pFET from each other and from other components.

FIG. 5 illustrates an inverter device 500 fabricated based on a bulk process in accordance with a third embodiment of the present invention, showing use of a semiconductor design layout based on the bulk process that is converted from another semiconductor design layout based on an Silicon-on-Insulator (SOI) process (FIG. 1B). The inverter device 500 is fabricated using a semiconductor design layout based on the bulk process that is generated using the method 200 (FIG. 2). A comparison of the location and composition of active devices, metal wires, interconnections, and other components of FIGS. 1B and 5 indicates that a relayout of the semiconductor design layout based on the SOI process (FIG. 1B) on the semiconductor surface was not required in order to fabricate the inverter device 500 based on a bulk process.

As depicted in FIG. 5, the inverter device 500 has a substrate 565 doped with a p-type dopant. A first epitaxy layer 580 is formed above the substrate 565, wherein the first epitaxy layer 580 has an n-type doping. A second epitaxy layer 581 is formed above the first epitaxy layer 580, wherein the second epitaxy layer 581 has a p-type doping. Further, via connections 593 (which are p-type doped) are formed in the first epitaxy layer 580, wherein the via connections 593 couple the substrate 565 to the second epitaxy layer 581. The via connections 593 may be deep p-wells. A via connection 594 (which is n-type doped) is formed in the second epitaxy layer 581, wherein the via connection 594 couples the first epitaxy layer 580 to the body 560 (which is n-type doped) of the pFET. The via connection 594 may be a deep n-well. The body 550 of the nFET is a surface p-well 550 while the body 560 of the pFET is a surface n-well 560. The conductive sub-surface structure, which is comprised of the substrate 565, the first epitaxy layer 580, the second epitaxy layer 581, via connections 593, and the via connection 594, supports routing voltage Vnw to the body 560 (which is n-type doped) of the pFET. This epitaxial routing structure for voltage routes the voltage Vnw to the body 560 (which is n-type doped) of the pFET by using the first epitaxy layer 580 and the via connection 594. Moreover, this epitaxial routing structure for body voltage routes the body voltage Vpw to the body 550 (which is p-type doped) of the nFET by using the substrate 565, the second epitaxy layer 581, and via connections 593. As a result, the inverter device 500 does not require creation of taps to the nFET and pFET, tap contacts, or tap contact metal wires, enabling conversion of the SOI design layout (FIG. 1B) to the bulk design layout (FIG. 5) without requiring a relayout of the SOI design layout. As described above, the voltage Vpw may be, for example, ground GND or a body voltage for biasing the nFET. Additionally, the voltage Vnw may be, for example, a supply voltage Vdd or a body voltage for biasing the pFET. Various supply voltage domains or body voltage domains may be formed as discussed above.

Description of epitaxial routing structure for voltage can be found in the patent application entitled "SYSTEMS AND METHODS FOR VOLTAGE DISTRIBUTION VIA MULTIPLE EPITAXIAL LAYERS", U.S. patent application Ser. No. 10/990,886, filed on Nov. 16, 2004 by Robert P. Masleid, which is assigned to the assignee of the present patent application, and which is incorporated by reference in its entirety herein.

An nFET is formed in the p-well 550 while and a pFET is formed in the n-well 560. The nFET includes source 510A doped with n-type dopant, drain 510B doped with n-type dopant, gate 530A, and body 550 doped with p-type dopant. The pFET includes source 520B doped with p-type dopant, drain 520A doped with p-type dopant, gate 530B, and body 560 doped with n-type dopant. The sources 510A and 520B and the drains 510B and 520A are diffusion regions. The source 510A is coupled to ground metal wire Gnd via contact 575 while source 520B is coupled to supply voltage metal wire Vdd via contact 574. Further, drain 510B and drain 520A are coupled via local interconnect (LI) 572. The local interconnect (LI) 572 is coupled to output metal wire 540 via contact 576. The input metal wire (not shown) is coupled to the gates 530A and 530B of nFET and pFET respectively. Moreover, shallow trench isolation (STI) regions 571 and the depletion regions of the P/N junctions isolate the nFET and the pFET from each other and from other components.

Figure 6:
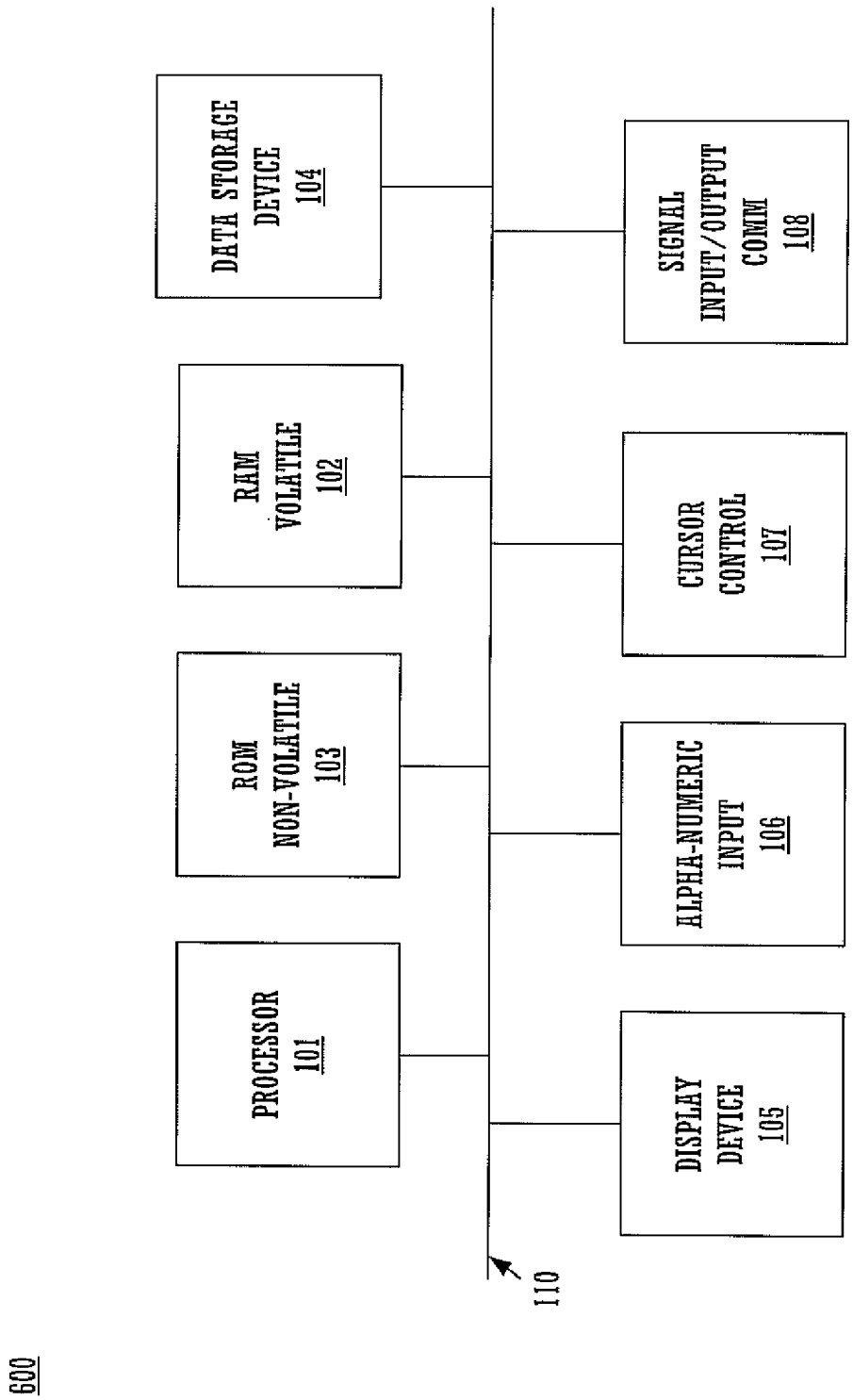
FIG. 6 illustrates an exemplary computer system on which embodiments of the present invention may be practiced.

FIG. 6 illustrates an exemplary computer system 600 on which embodiments of the present invention may be practiced. Aspects of the present invention can be implemented or executed on a computer system or any other computational system. Although a variety of different computer systems can be used with the present invention, an exemplary computer system 600 is shown in FIG. 6.

With reference to FIG. 6, portions of the present invention are comprised of computer-readable and computer executable instructions which reside, for example, in computer-usable media of an electronic system such as the exemplary computer system 600. FIG. 6 illustrates an exemplary computer system 600 on which embodiments of the present invention may be practiced. It is appreciated that the computer system 600 of FIG. 6 is exemplary only and that the present invention can operate within a number of different computer systems including general-purpose computer systems and embedded computer systems.

Computer system 600 includes an address/data bus 110 for communicating information, a central processor 101 coupled with bus 110 for processing information and instructions, a volatile memory 102 (e.g., random access memory RAM) coupled with the bus 110 for storing information and instructions for the central processor 101 and a non-volatile memory 103 (e.g., read only memory ROM) coupled with the bus 110 for storing static information and instructions for the processor 101. Exemplary computer system 600 also includes a data storage device 104 ("disk subsystem") such as a magnetic or optical disk and disk drive coupled with the bus 110 for storing information and instructions. Data storage device 104 can include one or more removable magnetic or optical storage media (e.g., diskettes, tapes), which are computer-readable memories. Memory units of computer system 600 include volatile memory 102, non-volatile memory 103 and data storage device 104.

Exemplary computer system 600 can further include a signal input/ouput communication device 108 (e.g., a network interface card "NIC") coupled to the bus 110 for interfacing with other computer systems. Also included in exemplary computer system 600 of FIG. 6 is an alphanumeric input device 106 including alphanumeric and function keys coupled to the bus 110 for communicating information and command selections to the central processor 101. Exemplary computer system 600 also includes a cursor control or directing device 107 coupled to the bus 110 for communicating user input information and command selections to the central processor 101. A display device 105 can also be coupled to the bus 110 for displaying information to the computer user. Display device 105 may be a liquid crystal device, other flat panel display, cathode ray tube, or other display device suitable for creating graphic images and alphanumeric characters recognizable to the user. Cursor control device 107 allows the user to dynamically signal the two-dimensional movement of a visible symbol (cursor) on a display screen of display device 105. Many implementations of cursor control device 107 are known in the art including a trackball, mouse, touch pad, joystick or special keys on alphanumeric input device 106 capable of signaling movement of a given direction or manner of displacement. Alternatively, it will be appreciated that a cursor can be directed and/or activated via input from alphanumeric input device 106 using special keys and key sequence commands.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of converting a first semiconductor design layout based on an Silicon-on-Insulator (SOI) process to a second semiconductor design layout based on a bulk process, said method comprising:
   removing an insulator layer of said SOI process beneath active devices in said first semiconductor design layout;
   adding to said first semiconductor design layout a conductive sub-surface structure for routing voltage; and
   converting said active devices from said SOI process to said bulk process to form said second semiconductor design layout without requiring a relayout of said first semiconductor design layout on a semiconductor surface.

2. The method as recited in claim 1 wherein said conductive sub-surface structure is utilized to route a supply voltage to a portion of said active devices.

3. The method as recited in claim 1 wherein said conductive sub-surface structure is utilized to route a body voltage for biasing to a portion of said active devices.

4. The method as recited in claim 1 further comprising:
   adding to said first semiconductor design layout a second conductive sub-surface structure for routing voltage, wherein said conductive sub-surface structure is utilized to route a first supply voltage to a first portion of said active devices, and wherein said second conductive sub-surface structure is utilized to route a second supply voltage to a second portion of said active devices.

5. The method as recited in claim 4 further comprising:
   isolating said conductive sub-surface structure from said second conductive sub-surface structure.

6. The method as recited in claim 1 further comprising:
   adding to said first semiconductor design layout a second conductive sub-surface structure for routing voltage, wherein said conductive sub-surface structure is utilized to route a first body voltage for biasing to a first portion of said active devices, and wherein said second conductive sub-surface structure is utilized to route a second body voltage for biasing to a second portion of said active devices.

7. The method as recited in claim 6 further comprising:
   isolating said conductive sub-surface structure from said second conductive sub-surface structure.

8. The method as recited in claim 1 further comprising:
   classifying said active devices into a first group and into a second group, wherein said first group represents active devices having a surface N-well with sufficient area for at least one tap thereto, and wherein said second group represents active devices having a surface N-well with insufficient area for at least one tap thereto, and
   wherein said adding to said first semiconductor design layout said conductive sub-surface structure for routing voltage comprises:
      placing said conductive sub-surface structure between at least one active device from said first group and at least one active device from said second group.

9. The method as recited in claim 1 wherein said conductive sub-surface structure comprises a deep N-well mesh.

10. The method as recited in claim 1 wherein said conductive sub-surface structure comprises:
    a substrate having a first type of doping;
    an epitaxial layer having a second type of doping and disposed above said substrate; and
    a via connection disposed through said epitaxial layer to connect said substrate to a surface well, wherein said via connection and said surface well have said first type of doping.

11. The method as recited in claim 10 wherein said first type of doping is an N-type doping and wherein said second type of doping is a P-type doping.

12. The method as recited in claim 1 wherein said conductive sub-surface structure comprises:
    a substrate having a first type of doping;
    a first epitaxial layer having a second type of doping and disposed above said substrate;
    a second epitaxial layer having said first type of doping and disposed above said first epitaxial layer;
    a first via connection disposed through said first epitaxial layer to connect said substrate to said second epitaxial layer, wherein said first via connection has said first type of doping; and
    a second via connection disposed through said second epitaxial layer to connect said first epitaxial layer to a surface well, wherein said second via connection and said surface well have said second type of doping.

13. The method as recited in claim 12 wherein said first type of doping is a P-type doping and wherein said second type of doping is an N-type doping.

14. A computer-readable medium comprising computer-executable instructions stored therein for performing a method of converting a first semiconductor design layout based on an Silicon-on-Insulator (SOI) process to a second semiconductor design layout based on a bulk process, said method comprising:
    removing an insulator layer of said SOI process beneath active devices in said first semiconductor design layout;
    adding to said first semiconductor design layout a conductive sub-surface structure for routing voltage; and
    converting said active devices from said SOI process to said bulk process to form said second semiconductor design layout without requiring a relayout of said first semiconductor design layout on a semiconductor surface.

15. The computer-readable medium as recited in claim 14 wherein said conductive sub-surface structure is utilized to route a supply voltage to a portion of said active devices.

16. The computer-readable medium as recited in claim 14 wherein said conductive sub-surface structure is utilized to route a body voltage for biasing to a portion of said active devices.

17. The computer-readable medium as recited in claim 14 wherein said method further comprises:
adding to said first semiconductor design layout a second conductive sub-surface structure for routing voltage, wherein said conductive sub-surface structure is utilized to route a first supply voltage to a first portion of said active devices, and wherein said second conductive sub-surface structure is utilized to route a second supply voltage to a second portion of said active devices.

18. The computer-readable medium as recited in claim 17 wherein said method further comprises:
isolating said conductive sub-surface structure from said second conductive sub-surface structure.

19. The computer-readable medium as recited in claim 14 wherein said method further comprises:
adding to said first semiconductor design layout a second conductive sub-surface structure for routing voltage, wherein said conductive sub-surface structure is utilized to route a first body voltage for biasing to a first portion of said active devices, and wherein said second conductive sub-surface structure is utilized to route a second body voltage for biasing to a second portion of said active devices.

20. The computer-readable medium as recited in claim 19 wherein said method further comprises:
isolating said conductive sub-surface structure from said second conductive sub-surface structure.

21. The computer-readable medium as recited in claim 14 wherein said method further comprises:
classifying said active devices into a first group and into a second group, wherein said first group represents active devices having a surface N-well with sufficient area for at least one tap thereto, and wherein said second group represents active devices having a surface N-well with insufficient area for at least one tap thereto, and
wherein said adding to said first semiconductor design layout said conductive sub-surface structure for routing voltage comprises:
placing said conductive sub-surface structure between at least one active device from said first group and at least one active device from said second group.

22. The computer-readable medium as recited in claim 14 wherein said conductive sub-surface structure comprises a deep N-well mesh.

23. The computer-readable medium as recited in claim 14 wherein said conductive sub-surface structure comprises:
a substrate having a first type of doping;
an epitaxial layer having a second type of doping and disposed above said substrate; and
a via connection disposed through said epitaxial layer to connect said substrate to a surface well, wherein said via connection and said surface well have said first type of doping.

24. The computer-readable medium as recited in claim 23 wherein said first type of doping is an N-type doping and wherein said second type of doping is a P-type doping.

25. The computer-readable medium as recited in claim 14 wherein said conductive sub-surface structure comprises:
a substrate having a first type of doping;
a first epitaxial layer having a second type of doping and disposed above said substrate;
a second epitaxial layer having said first type of doping and disposed above said first epitaxial layer;
a first via connection disposed through said first epitaxial layer to connect said substrate to said second epitaxial layer, wherein said first via connection has said first type of doping; and
a second via connection disposed through said second epitaxial layer to connect said first epitaxial layer to a surface well, wherein said second via connection and said surface well have said second type of doping.

26. The computer-readable medium as recited in claim 25 wherein said first type of doping is a P-type doping and wherein said second type of doping is an N-type doping.

* * * * *